United States Patent
Kim

(10) Patent No.: US 11,002,790 B2
(45) Date of Patent: May 11, 2021

(54) POWER GATING SYSTEM

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 15 days.

(21) Appl. No.: 16/459,434

(22) Filed: Jul. 1, 2019

(65) Prior Publication Data
US 2020/0141998 A1 May 7, 2020

(30) Foreign Application Priority Data

Nov. 7, 2018 (KR) .......................... 10-2018-0135679

(51) Int. Cl.
*G01R 31/3177* (2006.01)
*G01R 31/317* (2006.01)
*H03K 3/037* (2006.01)

(52) U.S. Cl.
CPC ..... *G01R 31/3177* (2013.01); *G01R 31/31721* (2013.01); *H03K 3/037* (2013.01)

(58) Field of Classification Search
CPC .......... G01R 31/3177; G01R 31/31721; H03K 3/037; H03K 3/0375
See application file for complete search history.

(56) References Cited

U.S. PATENT DOCUMENTS

| 2010/0005439 A1* | 1/2010 | Shikata ................... G06F 30/30 716/116 |
| 2013/0326309 A1* | 12/2013 | Yon Eda ............. G06F 12/0246 714/763 |
| 2014/0340134 A1* | 11/2014 | Shionoiri ............. H03K 3/0375 327/198 |
| 2018/0074122 A1 | 3/2018 | Payne et al. |

FOREIGN PATENT DOCUMENTS

KR 1020190075337 A 7/2019

OTHER PUBLICATIONS

Kunitake et al., Possibilities to miss predicting timing errors in Canary Flip-flops, 2011, IEEE, pp. 1-4.*
Assem et al., High-level synthesis-based design methodology for dynamic power-gated FPGAs, 2014, IEEE, pp. 1 to 4.*
Nigam et al., Zigzag Keeper: a new approach for low power CMOS circuits, 2012, International Jounral of Advanced Research in Computer and Communication Engineering, vol. 1, Issue 9, pp. 694-699.*

* cited by examiner

*Primary Examiner* — Shelly A Chase
(74) *Attorney, Agent, or Firm* — William Park & Associates Ltd.

(57) ABSTRACT

A power gating system may include a logic circuit area configured to block a supply voltage from being supplied to a plurality of logic gates, when a test power-down mode is enabled; and a plurality of error detection circuits configured to detect logic gates whose output nodes float, among the plurality of logic gates, when the test power-down mode is activated.

31 Claims, 6 Drawing Sheets

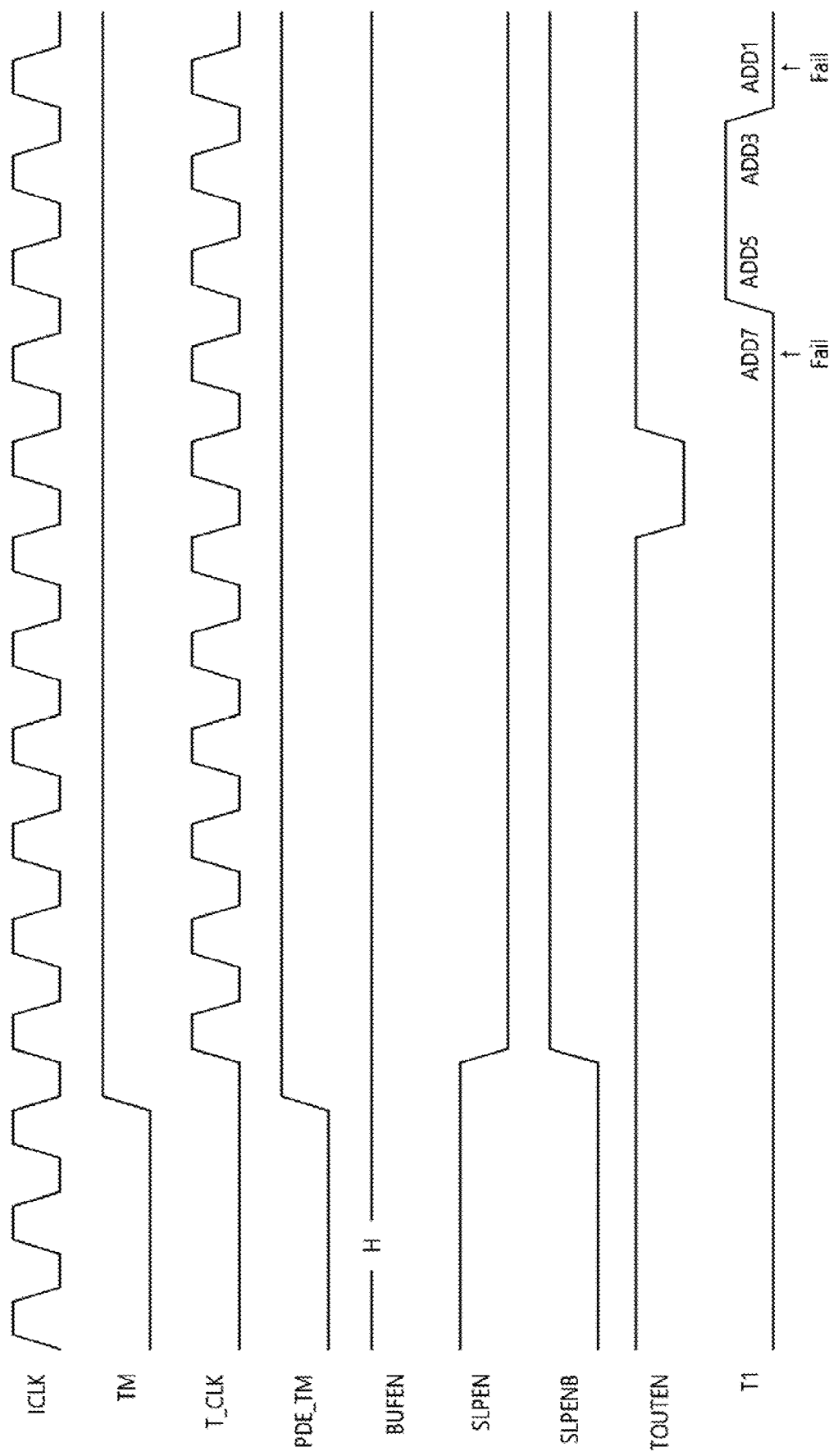

POWER GATING SYSTEM

CROSS-REFERENCES TO RELATED APPLICATION

The present application claims priority under 35 U.S.C. § 119(a) to Korean application number 10-2018-0135679, filed on Nov. 7, 2018, in the Korean Intellectual Property Office, which is incorporated herein by reference in its entirety.

BACKGROUND

1. Technical Field

Various embodiments generally relate to a semiconductor circuit, and more particularly, to a power gating system.

2. Related Art

Recently, electronic devices, for example, portable electronic devices have been reduced in size and weight, but the number of function blocks embedded in each of the portable electronic devices tends to continuously increase.

In particular, since the portable electronic device is operated by a limited power supply, i.e. a battery, the portable electronic device needs to reduce power which is unnecessarily consumed by function blocks in a power-down mode.

To this end, the portable electronic device employs a power gating technique for preventing unnecessary power supply to the function blocks in the power-down mode.

One example of a power gating technique is zigzag power gating.

Zigzag power gating refers to a method that removes power from some of a plurality of logic gates included in the function blocks of the electronic device in the power-down mode, except for the rest of the logic gates which require regular power.

As illustrated in FIG. 1, a zigzag power gating circuit according to the related art may include first to fourth power lines 1 to 4, logic gates 11 to 13 and power gating switches 5 and 6.

In a normal operation mode, the logic gates 11 and 13 receive a second supply voltage VDD_ZPG, through the second power line 2, having substantially the same level (excluding a voltage drop caused by a power gate switch) as a regular power, i.e. a first supply voltage VDD provided from the outside and receive a first ground voltage VSS through the third power line 3, and the logic gate 12 receives the first supply voltage VDD through the first power line 1, and receives a second ground voltage VSS_ZPG through the fourth power line 4.

In a power-down mode, the power gating switches 5 and 6 are turned off according to power gating control signals SLPEN and SLPENB, i.e. a low-level power gating control signal SLPEN and a high-level power gating control signal SLPENB, thereby removing power to the logic gates 11 and 13.

According to a normal power gating design, the second ground voltage VSS_ZPG, not the second supply voltage VDD_ZPG, needs to be gated to the logic gate 13 such that the final output terminal does not float in the power-down mode. However, due to a design error or process error, the power gating may be incorrectly connected as illustrated in FIG. 1.

In this case, the logic value of an output signal of the logic gate 13 is not changed to a different value from a target value, but a leakage current may be generated by floating.

For example, when the first supply voltage VDD is 1.05V, the second power line 2 may float in the power-down mode, such that the second supply voltage VDD_ZPG ranges from 600 mV to 800 mV, and the second ground voltage VSS_ZPG ranges from 200 mV to 300 mV.

Therefore, although a leakage current is generated by the floating, an input signal of the logic gate 13 does not exceed a threshold voltage, such that the logic value of the output signal is not changed to a different value from the target value. Thus, the above-described leakage current may not be detected through a general digital or analog test.

SUMMARY

In an embodiment, a power gating system may include: a logic circuit area configured to block a supply voltage from being supplied to a plurality of logic gates when a test power-down mode is enabled; and a plurality of error detection circuits configured to detect logic gates whose output nodes float, among the plurality of logic gates, when the test power-down mode is activated.

In an embodiment, a power gating system may include: a logic circuit area configured to block a supply voltage from being supplied to a plurality of logic gates in response to an activation of a power gating control signal; a power gating control circuit configured to activate the power gating control signal according to a test power-down mode signal; and a plurality of error detection circuits configured to receive output node values of some of the plurality of logic gates, and detect whether the received output node values float.

In an embodiment, a power gating system may include: a logic circuit area configured to block a supply voltage from being supplied to a plurality of logic gates according to a power gating control signal; a buffer configured to buffer a clock signal, a chip select signal and a command/address signal according to a buffer enable signal, and output the buffered signals; a command decoder configured to generate a first power-down mode signal and a second power-down mode signal by decoding a test mode signal and the chip select signal and command/address signal buffered in the buffer; a power gating control circuit configured to generate the buffer enable signal and the power gating control signal according to the first power-down mode signal and the second power-down mode signal; and a plurality of error detection circuits configured to receive output node values of some of the plurality of logic gates, and generate detection signals by detecting whether the received output node values float.

In an embodiment, a power gating system may include: a logic circuit area configured to block a supply voltage from being supplied to a plurality of logic gates according to an activated power gating control signal; a buffer configured to buffer a clock signal, a chip select signal and a command/address signal according to an activated buffer enable signal, and output the buffered signals; a command decoder configured to generate a first power-down mode signal and a second power-down mode signal by decoding a test mode signal and the chip select signal and command/address signal buffered in the buffer; a power gating control circuit configured to deactivate the buffer enable signal and activate the power gating control signal, when the first power-down mode signal is activated, and activate the buffer enable signal and the power gating control signal when the second power-down mode signal is activated; and a plurality of error detection circuits configured to receive output node values of some of the plurality of logic gates, and generate detection signals by detecting whether the received output node values float.

In an embodiment, a power gating system may include: a logic circuit area configured to block a supply voltage from being supplied to a plurality of logic gates when a test power-down mode is enabled; and a plurality of error detection circuits configured to detect logic gates whose output nodes float, among the plurality of logic gates, when the test power-down mode is activated, wherein the plurality of error detection circuits are configured to detect the logic gates with floating output nodes by applying a first voltage with a lower level than the supply voltage and a second voltage with a higher level than the supply voltage.

BRIEF DESCRIPTION OF THE DRAWINGS

FIG. 6 is a timing diagram for describing a test operation of the power gating system in accordance with the present embodiment.

DETAILED DESCRIPTION

Hereinafter, a power gating system according to the present disclosure will be described below with reference to the accompanying drawings through exemplary embodiments.

Various embodiments are directed to a power gating system capable of detecting an error of a power gating circuit.

Figure 2:
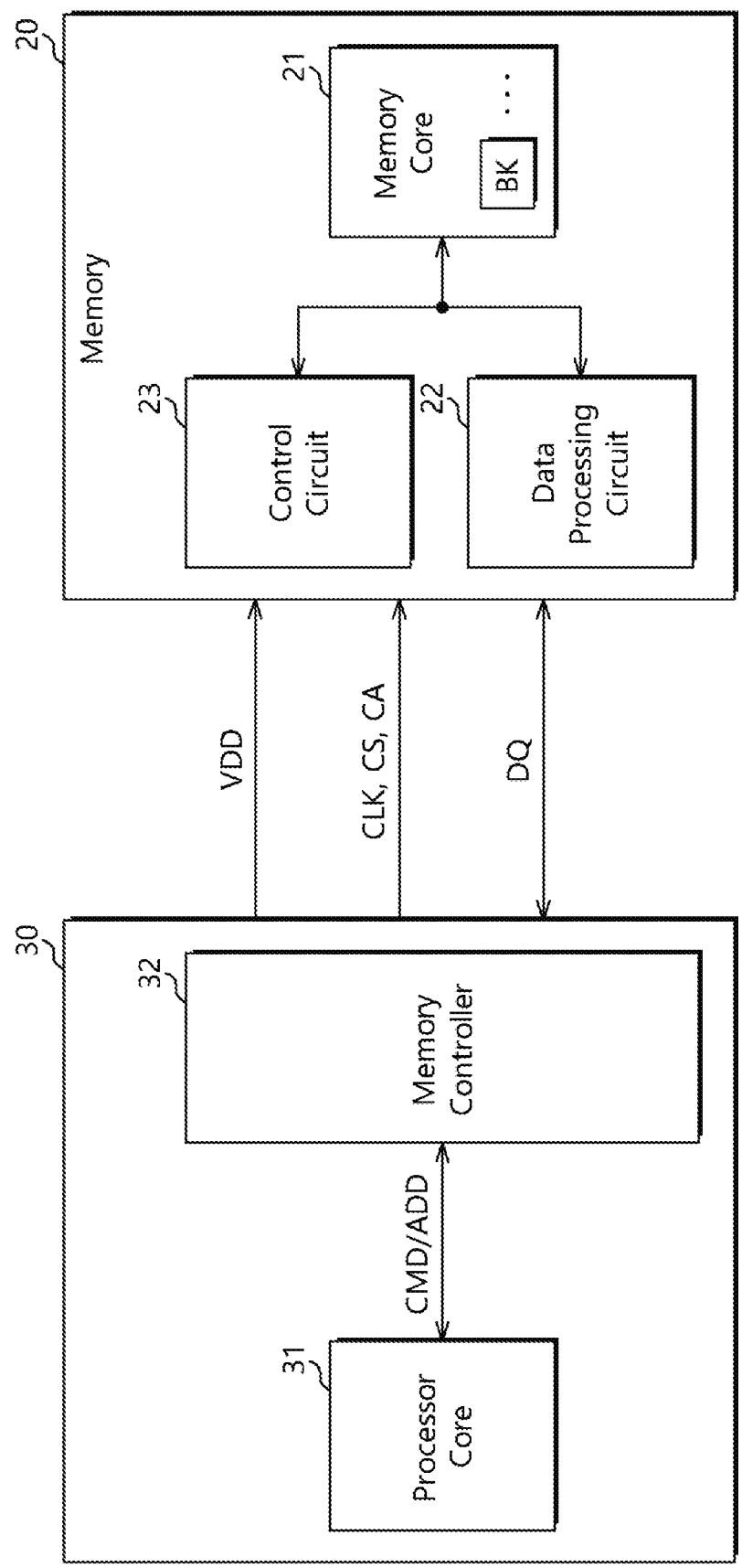
FIG. 2 illustrates a configuration of a memory system in accordance with an embodiment.

FIG. 2 illustrates a configuration of a memory system in accordance with an embodiment.

Referring to FIG. 2, the memory system 10, in accordance with the present embodiment, may include a memory 20 and a processor 30.

The processor 30 may include a central processing unit (CPU) or a graphic processing unit (GPU).

The processor 30 may include a processor core 31 and a memory controller 32.

The processor core 31 may provide the memory controller 32 with various commands CMD and addresses ADD for controlling the memory 20.

The memory controller 32 may control the memory 20 by providing the memory 20 with a supply voltage VDD, a clock signal CLK, a chip select signal CS and a command/address signal CA, according to the command CMD and the address ADD provided from the processor core 31.

The memory controller 32 may transfer/receive data DQ to/from the memory 20.

The memory 20, i.e. a semiconductor memory, may include a memory core 21, a data processing circuit 22 and a control circuit 23.

The memory core 21 may include a plurality of unit memory areas, for example, memory banks BK and circuit components for data input/output of the memory banks BK.

The data processing circuit 22 may perform data input/output-related operations between the memory core 21 and the memory controller 32.

The control circuit 23 may control a data read/write operation and a power gating-related operation of the memory 20, according to the chip select signal CS and the command/address signal CA, which are provided from the memory controller 32 of the processor 30.

Figure 3:
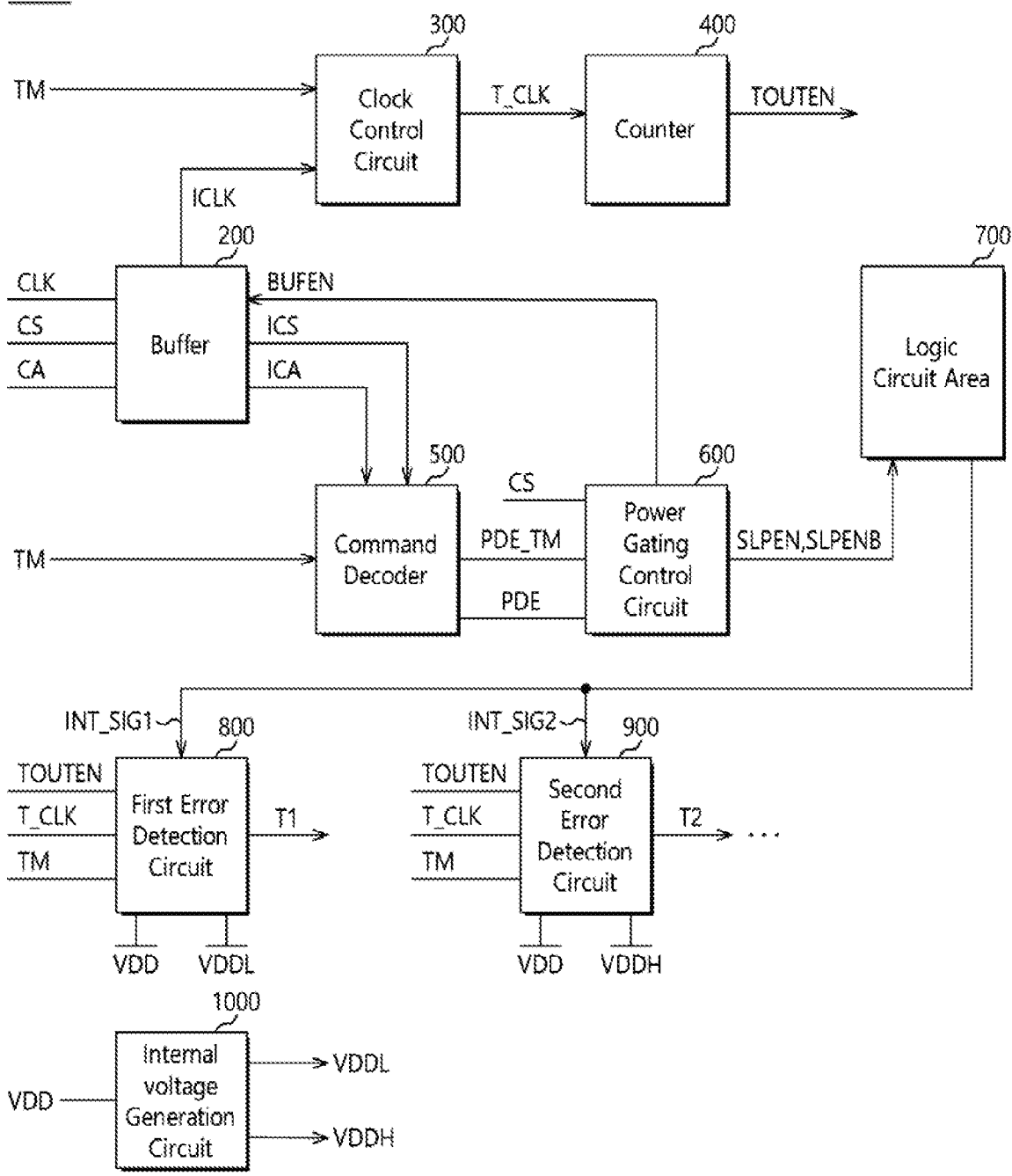
FIG. 3 illustrates a configuration of a power gating system in accordance with an embodiment.

FIG. 3 illustrates a configuration of a power gating system in accordance with an embodiment.

The power gating system 100, in accordance with the present embodiment, may be configured in the memory 20 of FIG. 2, for example.

Referring to FIG. 3, the power gating system 100, in accordance with the present embodiment, may include a buffer 200, a clock control circuit 300, a counter 400, a command decoder 500, a power gating control circuit 600, a logic circuit area 700, a plurality of error detection circuits and an internal voltage generation circuit 1000.

The plurality of error detection circuits may include a first error detection circuit 800 and a second error detection circuit 900, for example.

The buffer 200 may be enabled according to a buffer enable signal BUFEN. When the buffer 200 is enabled, the buffer 200 may buffer the clock signal CLK, the chip select signal CS and the command/address signal CA, and output the buffered clock signal ICLK, chip select signal ICS and command/address signal ICA.

The command decoder 500 may generate first and second power-down mode signals by decoding a test mode signal TM and the chip select signal ICS and command/address signal ICA, buffered through the buffer 200.

Hereafter, the first power-down mode signal will be referred to as a power-down mode signal PDE, and the second power-down mode signal will be referred to as a test power-down mode signal PDE_TM.

The clock control circuit 300 may output, as a test clock signal T_CLK, pulse signals corresponding to an active period of the test mode signal TM, among pulses of the buffered clock signal ICLK.

For example, the clock control circuit 300 may perform an AND operation on the buffered clock signal ICLK and the test mode signal TM, and output the operation result as the test clock signal T_CLK.

The counter 400 may generate a test output enable signal TOUTEN by counting the test clock signal T_CLK.

For example, the counter 400 may generate the test output enable signal TOUTEN, which corresponds to a transition timing of a pulse corresponding to a preset turn, among pulses of the test clock signal T_CLK.

The power gating control circuit 600 may generate the buffer enable signal BUFEN and power gating control signals SLPEN and SLPENB according to the chip select signal CS, the power-down mode signal PDE and the test power-down mode signal PDE_TM.

The power-down mode signal PDE, for controlling the memory 20 to enter a normal power-down mode, may not only remove power to the logic circuits, but also block the supply of the clock signal CLK to the memory 20.

The test power-down mode signal PDE_TM, for operating a test mode to detect a power gating error, may remove power to the logic circuits, but allow the supply of the clock signal CLK to the memory 20 in order to perform a test operation.

When the power-down mode signal PDE is activated, the power gating control circuit 600 may deactivate the buffer enable signal BUFEN to a low level, for example, to block the supply of the clock signal CLK to the memory 20, and activate the power gating control signals SLPEN and SLPENB to a low level/high level, for example, to remove power to the logic circuits.

When the test power-down mode signal PDE_TM is activated, the power gating control circuit 600 may activate the buffer enable signal BUFEN to supply the clock signal CLK to the memory 20, and activate the power gating control signals SLPEN and SLPENB to remove power to the logic circuits.

When the chip select signal CS transitions during the power-down mode, the power gating control circuit 600 may recognize an exit from the power-down mode, and deactivate the power gating control signals SLPEN and SLPENB.

Figure 1:
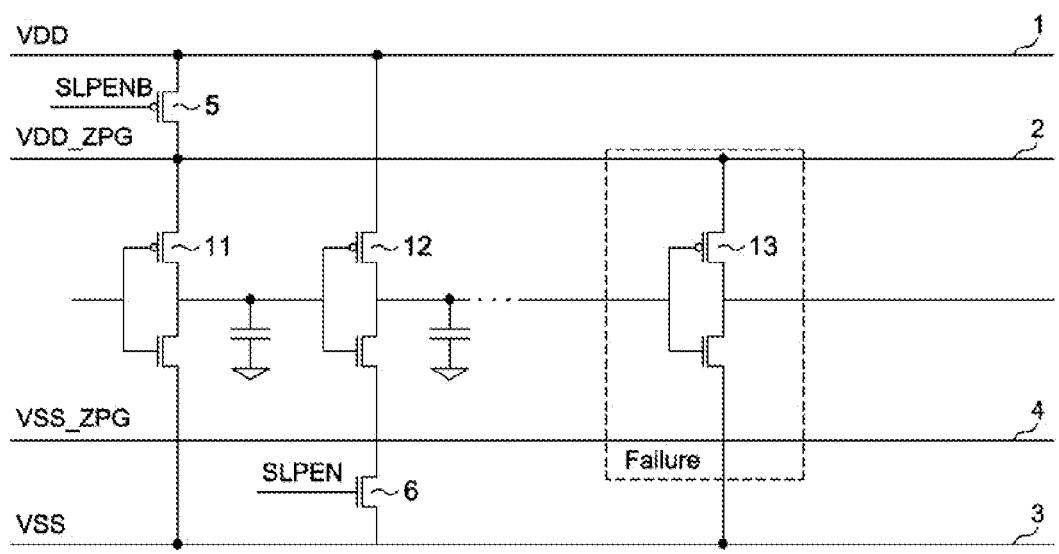
FIG. 1 illustrates a configuration of a logic circuit area to which zigzag power gating according to the related art is applied.

The logic circuit area 700 may include a plurality of logic gates, constituting function blocks, and have a zigzag power gating structure in which the logic gates are coupled as illustrated in FIG. 1.

The logic circuit area 700 may include power gating switches configured to block the second supply voltage VDD_ZPG from being applied to the corresponding logic gates in response to activation of the power gating control signal SLPEN.

The first error detection circuit 800 may generate first detection signals T1 by detecting whether output node values of one or more logic gates, in which a first-type power gating error is likely to occur, among the logic gates of the logic circuit area 700, contain an error. Hereafter, the output node values will be referred to as first internal signals INT_SIG1.

The first internal signals INT_SIG1 may include one or more of data and an address signal.

The first-type power gating error may occur when the output node floats as the second ground voltage VSS_ZPG is power-gated, even though the second supply voltage VDD_ZPG should have been power-gated to set the output node value to a logic low value.

Among the logic gates of the logic circuit area 700, specific logic gates, for example, logic gates which are designed to have a larger size than the other logic gates in order to drive the final output (logic low), are highly likely to generate a leakage current due to floating caused by the first-type power gating error.

Therefore, the power gating system, in accordance with the present embodiment, may detect the first-type power gating error by using the output node values, i.e., first internal signals INT_SIG1, of the specific logic gates, among the logic gates of the logic circuit area 700, in which the first-type power gating error is likely to occur.

The first error detection circuit 800 may generate the first detection signals T1 by detecting whether the first internal signals INT_SIG1 of the logic circuit area 700 contain an error, according to a first test supply voltage VDDL, the test output enable signal TOUTEN, the test clock signal T_CLK and the test mode signal TM.

The second error detection circuit 900 may generate second detection signals T2 by detecting whether output node values of one or more logic gates, in which a second-type power gating error is likely to occur, among the logic gates of the logic circuit area 700, contain an error. Hereafter, the output node values will be referred to as second internal signals INT_SIG2.

The second internal signals INT_SIG2 may include one or more of data and an address signal.

The second-type power gating error may occur when the output node floats as the second supply voltage VDD_ZPG is power-gated, even though the second ground voltage VSS_ZPG should have been power-gated to set the output node value to a logic high value.

Among the logic gates of the logic circuit area 700, specific logic gates, for example, logic gates which are designed to have a larger size than the other logic gates in order to drive the final output (logic high), are highly likely to generate a leakage current due to floating caused by the second-type power gating error.

Therefore, the power gating system, in accordance with the present embodiment, may detect the second-type power gating error by using the output node values, i.e., second internal signals INT_SIG2, of the specific logic gates, among the logic gates of the logic circuit area 700, in which the second-type power gating error is likely to occur.

The second error detection circuit 900 may generate the second detection signals T2 by detecting whether the second internal signals INT_SIG2 of the logic circuit area 700 contain an error, according to a second test supply voltage VDDH, the test output enable signal TOUTEN, the test clock signal T_CLK and the test mode signal TM.

The internal voltage generation circuit 1000 may generate the first and second test supply voltages VDDL and VDDH using the first supply voltage VDD.

The internal voltage generation circuit 1000 may generate the first test supply voltage VDDL having a lower level than the first supply voltage VDD and the second test supply voltage VDDH having a higher level than the first supply voltage VDD, using a level shifter and/or divider resistor.

For example, when the first supply voltage VDD is assumed to be 1.05V, the first test supply voltage VDDL may range from 400 to 500 mV, and the second test supply voltage VDDH may become 1.8V.

Figure 4:
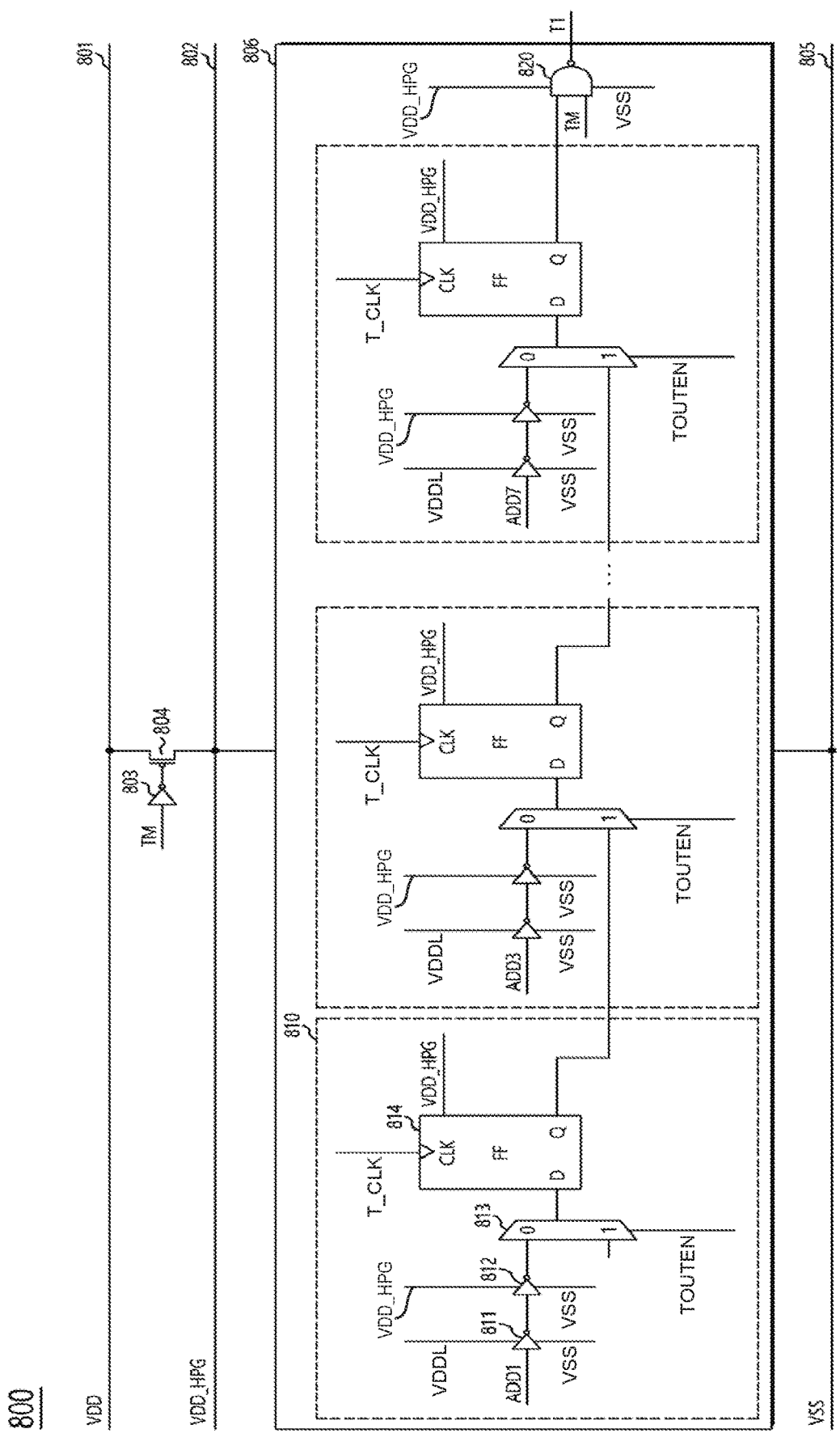
FIG. 4 illustrates a configuration of a first error detection circuit of FIG. 3.

FIG. 4 illustrates a configuration of the first error detection circuit 800 of FIG. 3.

As illustrated in FIG. 4, the first error detection circuit 800 may include a first power line 801, a second power line 802, an inverter 803, a power gating switch 804, a third power line 805 and a scan chain 806.

The first supply voltage VDD may be applied to the first power line 801.

The power gating switch 804 may be coupled between the second power line 802 and the first power line 801.

A voltage applied to the second power line 802 through the power gating switch 804 will be referred to as a third supply voltage VDD_HPG.

The inverter 803 may invert the test mode signal TM, and output the inverted signal to the power gating switch 804.

When the test mode signal TM is at an inactive level, for example, a low level, the power gating switch 804 may be turned off by the inverter 803, such that power is not supplied to the scan chain 806.

The scan chain 806 may be coupled between the second power line 802 and the third power line 805.

The ground voltage VSS may be applied through the third power line 805.

The scan chain 806 may operate according to the test clock signal T_CLK, detect whether the first internal signals INT_SIG1 float, sequentially transfer the detection results to the next stages according to the test output enable signal TOUTEN, and output the detection results as the first detection signals T1.

The scan chain 806 may include a plurality of unit blocks 810 and a floating prevention circuit 820.

The plurality of unit blocks 810 may be configured in the same manner.

Each of the unit blocks 810 may be configured to perform inversion operations. For example, each of the unit blocks 810 may include a first inverter 811 and a second inverter 812. Furthermore, each of the unit blocks 810 may include a multiplexer 813 and a flip-flop 814.

The second inverter 812, the multiplexer 813 and the flip-flop 814 may receive the third supply voltage VDD_HPG and the ground voltage VSS as operating voltages.

The first inverter 811 may receive the first test supply voltage VDDL and the ground voltage VSS as operating voltages.

The first inverter 811 may receive any one of the first internal signals INT_SIG1, for example, an address signal ADD1. The first inverter 811 may invert the received signal and output the inverted signal.

The second inverter 812 may invert the output signal of the first inverter 811 and output the inverted signal.

The multiplexer 813 may select an output signal of the previous stage or the output signal of the second inverter 812 according to the test output enable signal TOUTEN, and output the selected signal.

The flip-flop 814 may latch the output signal of the multiplexer 813 according to the test clock signal T_CLK, and output the latched signal.

The floating prevention circuit 820 may perform a NAND operation on an output signal of the last unit block 810 and the test mode signal TM, and output the operation result as the first detection signals T1.

When the test mode signal TM is at an inactive level, i.e. a low level, the floating prevention circuit 820 may retain the output node at a logic high level, for example, and thus prevent floating of the output node of the scan chain 806, that is, the node from which the first detection signals T1 are outputted. In other words, the floating prevention circuit 820 may prevent floating of the output node of the scan chain 806 by retaining an output node thereof at a predetermined logic value, when the test mode signal TM is at an inactive level.

The word "predetermined" as used herein with respect to a parameter, such as a predetermined logic level combination, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The first error detection circuit, in accordance with the present embodiment, may detect the first-type power gating error by applying the first test supply voltage VDDL to the first input terminals of the respective unit blocks 810 of the scan chain 806, that is, the first inverters 811, unlike the other components.

For example, suppose that the first-type power gating error is present in the logic gate from which the address signal ADD1 is outputted, and the first supply voltage VDD is 1.05V.

The node from which the address signal ADD1 is outputted may float at 300 mV. However, when the first inverter 811 is operated by the first supply voltage VDD or the third supply voltage VDD_HPG, having a level corresponding to the first supply voltage VDD, the output value of the first inverter 811 may not be inverted to a logic low level. Thus, an abnormality of the logic value may not be detected.

In the present embodiment, since the first inverters 811 of the respective unit blocks 810 are operated by the first test supply voltage VDDL of 400 to 500 mV, the output value of the first inverter 811 may be inverted to a logic low level.

When the output of the first inverter 811 in any one of the plurality of unit blocks 810 is inverted to a logic low level, the first error detection circuit 800 may detect that the first-type power gating error is present in the corresponding logic gate of the logic circuit area 700.

Figure 5:
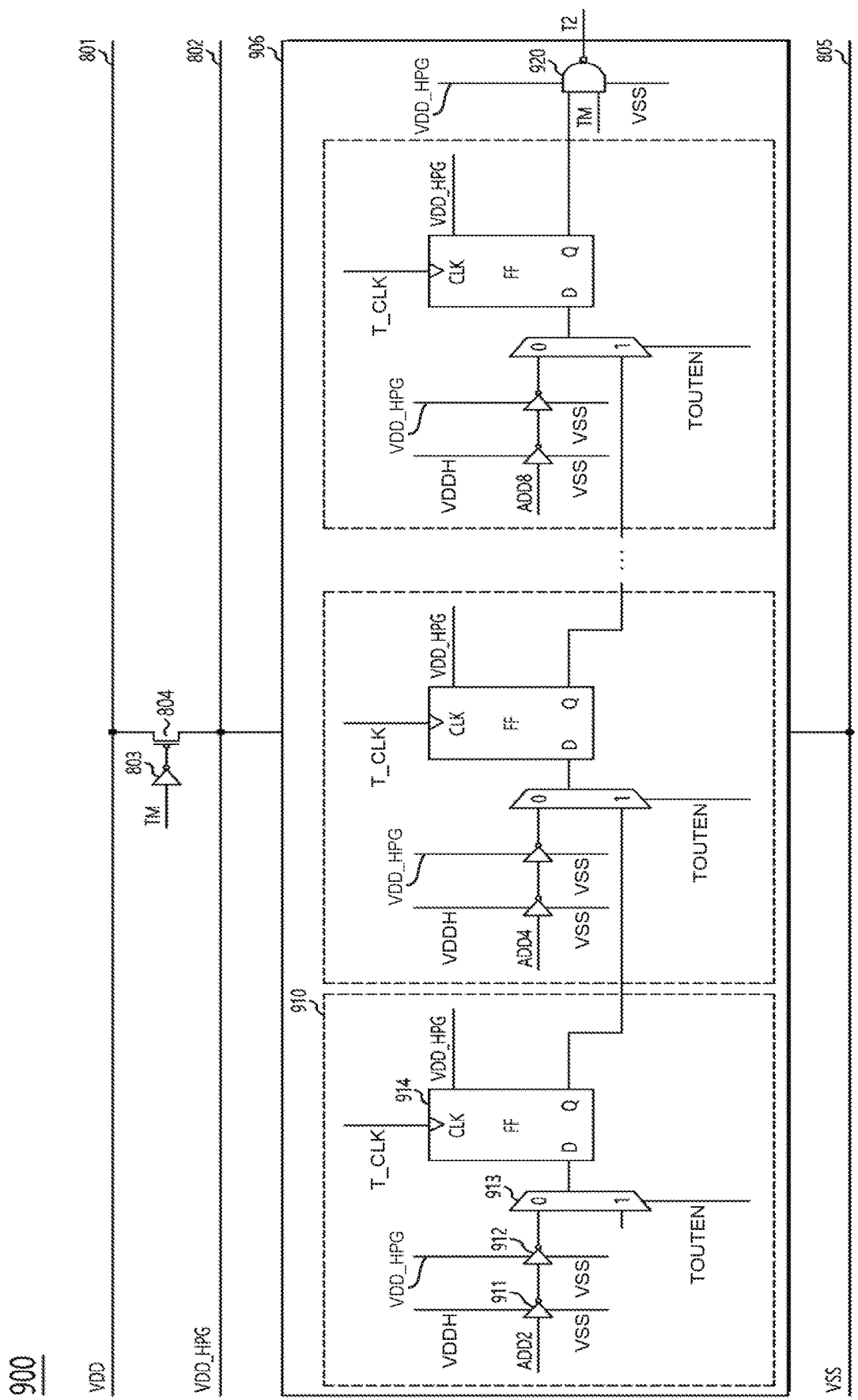
FIG. 5 illustrates a configuration of a second error detection circuit of FIG. 3.

FIG. 5 illustrates a configuration of the second error detection circuit 900 of FIG. 3.

As illustrated in FIG. 5, the second error detection circuit 900 may include a first power line 801, a second power line 802, an inverter 803, a power gating switch 804, a third power line 805 and a scan chain 906.

The first power line 801, the second power line 802, the inverter 803, the power gating switch 804 and the third power line 805 may be configured in the same manner as illustrated in FIG. 4, and the detailed descriptions thereof will be omitted herein.

The scan chain 906 may operate according to the test clock signal T_CLK, detect whether the second internal signals INT_SIG2 float, sequentially transfer the detection results to the next stages according to the test output enable signal TOUTEN, and output the detection results as the second detection signals T2.

The scan chain 906 may include a plurality of unit blocks 910 and a floating prevention circuit 920.

The plurality of unit blocks 910 may be configured in the same manner.

Each of the unit blocks 910 may be configured to perform inversion operations. For example, each of the unit blocks 910 may include a first inverter 911 and a second inverter 912. Furthermore, each of the unit blocks 910 may include a multiplexer 913 and a flip-flop 914.

The second inverter 912, the multiplexer 913 and the flip-flop 914 may receive the third supply voltage VDD_HPG and the ground voltage VSS as operating voltages.

The first inverter 911 may receive the second test supply voltage VDDH and the ground voltage VSS as operating voltages.

The first inverter 911 may receive any one of the second internal signals INT_SIG2, for example, an address signal ADD2. The first inverter 911 may invert the received signal, and output the inverted signal.

The second inverter 912 may invert the output signal of the first inverter 911 and output the inverted signal.

The multiplexer 913 may select an output signal of the previous stage or the output signal of the second inverter 912 according to the test output enable signal TOUTEN, and output the selected signal.

The flip-flop 914 may latch the output signal of the multiplexer 913 according to the test clock signal T_CLK, and output the latched signal.

The floating prevention circuit 920 may perform a NAND operation on an output signal of the last unit block 910 and the test mode signal TM, and output the operation result as the second detection signals T2.

When the test mode signal TM is at an inactive level, i.e. a low level, the floating prevention circuit 920 may retain the output node at a logic high level, for example, in order to prevent floating. In other words, the floating prevention circuit 920 may prevent floating of the output node of the scan chain 906 by retaining an output node thereof at a predetermined logic value, when the test mode signal TM is at an inactive level.

The second error detection circuit, in accordance with the present embodiment, may detect the second-type power gating error by applying the second test supply voltage VDDH to the first input terminals of the respective unit blocks 910 of the scan chain 906, i.e. the first inverters 911, unlike the other components.

For example, suppose that the second-type power gating error is present in the logic gate from which the address signal ADD2 is outputted, and the first supply voltage VDD is 1.05V.

The node from which the address signal ADD2 is outputted may float at 700 to 800 mV. However, when the first inverter 911 is operated by the first supply voltage VDD or the third supply voltage VDD_HPG, having a level corresponding to the first supply voltage VDD, the output value of the first inverter 911 may not be inverted to a logic high level. Thus, an abnormality of the logic value may not be detected.

In the present embodiment, since the first inverters 911 of the respective unit blocks 910 are operated by the second test supply voltage VDDH of 1.8V, the output value of the first inverter 911 may be inverted to a logic high level.

When the output of the first inverter 911 in any one of the plurality of unit blocks 910 is inverted to a logic high level, the second error detection circuit 900 may detect that the second-type power gating error is present in the corresponding logic gate of the logic circuit area 700.

FIG. 6 is a timing diagram for describing a test operation of the power gating system, in accordance with the present embodiment, the present embodiment being an operation of the first error detection circuit 800 to detect the first-type power gating error.

As illustrated in FIG. 6, the test clock signal T_CLK may be activated by the clock control circuit 300 as the test mode signal TM is activated.

According to the test mode signal TM, the command decoder 500 may activate the test power-down mode signal PDE_TM.

As the test power-down mode signal PDE_TM is activated, the power gating control circuit 600 may activate the buffer enable signal BUFEN and the power gating control signals SLPEN and SLPENB. The buffer enable signal BUFEN may be already activated according to the chip select signal CS by the power gating control circuit 600 before the activation of the test power-down mode signal PDE_TM. The power gating control circuit 600 may activate the buffer enable signal BUFEN according to the activation of the test power-down mode signal PDE_TM when the buffer enable signal BUFEN is in a deactivate state.

As the power gating control signals SLPEN and SLPENB are activated, power to the logic gates of the logic circuit area 700 may be removed.

During a period in which the test mode signal TM is activated, the first error detection circuit 800 detects whether the first internal signals INT_SIG1 (for example, the address signals ADD1, ADD3, ADD5 and ADD7) float, and latch the detection results in the flip-flops 814, according to the test clock signal T_CLK.

When the test output enable signal TOUTEN is activated, the first error detection circuit 800 may output the signals latched in the flip-flops 814 as the first detection signals T1 through the multiplexers 813.

When the output of the first inverter 811 in any one of the plurality of unit blocks 810 is inverted to a logic low level, the corresponding first detection signal T1 may have a logic low value.

Since the address signals ADD1 and ADD7 are at a logic low level, the first error detection circuit 800 may check that the first-type power gating error is present in the logic gates that output the address signals ADD1 and ADD7.

The second error detection circuit 900 may also be operated in the same manner as the first error detection circuit 800.

When the output of the first inverter 911 in any one of the plurality of unit blocks 910 of the second error detection circuit 900 is inverted to a logic high level, the corresponding second detection signal T2 may have a logic high value.

Therefore, the second error detection circuit 900 may check that the second-type power gating error is present in the logic gates that output a signal having a logic high value, among the second internal signals INT_SIG2 (for example, the address signals ADD2, ADD4, ADD6 and ADD8).

While various embodiments have been described above, it will be understood to those skilled in the art that the embodiments described are examples only. Accordingly, the power gating system described herein should not be limited based on the described embodiments.

What is claimed is:

1. A power gating system comprising:
   a logic circuit area configured to block a supply voltage from being supplied to a plurality of logic gates when a test power-down mode is enabled; and
   a plurality of error detection circuits configured to detect logic gates whose output nodes float, among the plurality of logic gates, when the test power-down mode is activated.

2. The power gating system according to claim 1, wherein some of the plurality of logic gates are power-gated for the supply voltage, and
   the other logic gates of the plurality of logic gates are power-gated for a ground voltage.

3. The power gating system according to claim 1, wherein one of the plurality of error detection circuits detects the floating of the output nodes of some of the plurality of logic gates and sets output node values to a logic low value in the test power down mode.

4. The power gating system according to claim 3, wherein an other one of the plurality of error detection circuits detects the floating of the output nodes of some of the plurality of logic gates and sets output nodes values to a logic high value in the test power down mode.

5. The power gating system according to claim 1, wherein one of the plurality of error detection circuits receives output node values of some of the plurality of logic gates, which are set to a logic low value according to a voltage having a lower level than the supply voltage in the test power-down mode.

6. The power gating system according to claim 5, wherein an other one of the plurality of error detection circuits receives output node values of some of the plurality of logic gates, which are set to a logic high value according to a voltage having a higher level than the supply voltage in the test power-down mode.

7. A power gating system comprising:
   a logic circuit area configured to block a supply voltage from being supplied to a plurality of logic gates in response to an activation of a power gating control signal;
   a power gating control circuit configured to activate the power gating control signal according to a test power-down mode signal; and
   a plurality of error detection circuits configured to receive output node values of some of the plurality of logic gates, and detect whether the received output node values float.

8. The power gating system according to claim 7, wherein some of the plurality of logic gates are power-gated for the supply voltage, and the other logic gates of the plurality of logic gates are power-gated for a ground voltage.

9. The power gating system according to claim 7, further comprising a command decoder configured to generate the test power-down mode signal according to a test mode signal.

10. The power gating system according to claim 7, wherein the plurality of error detection circuits comprise a first error detection circuit and a second error detection circuit,
wherein the first error detection circuit comprises a scan chain including a plurality of first unit blocks,
wherein each of the first unit blocks comprises:
an inverter configured to receive any one of the output node values according to a voltage having a lower level than the supply voltage;
a multiplexer configured to select an output signal of a previous stage or an output signal of the inverter according to a test output enable signal, and output the selected signal; and
a flip-flop configured to latch the output signal of the multiplexer according to a test clock signal, and output the latched signal.

11. The power gating system according to claim 10, wherein the second error detection circuit comprises a scan chain including a plurality of second unit blocks,
wherein each of the second unit blocks comprises:
an inverter configured to receive any one of the output node values according to a voltage having a higher level than the supply voltage;
a multiplexer configured to select an output signal of a previous stage or an output signal of the inverter according to the test output enable signal, and output the selected signal; and
a flip-flop configured to latch the output signal of the multiplexer according to the test clock signal, and output the latched signal.

12. The power gating system according to claim 11, wherein any one of the plurality of error detection circuits further comprises a floating prevention circuit configured to prevent floating of an output node of the scan chain by retaining an output node thereof at a predetermined logic value, when a test mode signal is deactivated.

13. The power gating system according to claim 7, further comprising:
a clock control circuit configured to output pulse signals as the test clock signal, the pulse signals corresponding to an active period of the test mode signal, among pulses of a clock signal; and
a counter configured to generate the test output enable signal by counting the test clock signal.

14. A power gating system comprising:
a logic circuit area configured to block a supply voltage from being supplied to a plurality of logic gates according to a power gating control signal;
a buffer configured to buffer a clock signal, a chip select signal and a command/address signal according to a buffer enable signal, and output the buffered signals;
a command decoder configured to generate a first power-down mode signal and a second power-down mode signal by decoding a test mode signal and the chip select signal and command/address signal buffered in the buffer;
a power gating control circuit configured to generate the buffer enable signal and the power gating control signal according to the first power-down mode signal and the second power-down mode signal; and a plurality of error detection circuits configured to receive output node values of some of the plurality of logic gates, and generate detection signals by detecting whether the received output node values float.

15. The power gating system according to claim 14, wherein when the second power-down mode signal is activated, one of the plurality of error detection circuits receives output node values of some of the plurality of logic gates, which are set to a logic low value, according to a voltage having a lower level than the supply voltage.

16. The power gating system according to claim 14, wherein when the second power-down mode signal is activated, one of the plurality of error detection circuits receives output node values of some of the plurality of logic gates, which are set to a logic high value according to a voltage having a higher level than the supply voltage.

17. The power gating system according to claim 14, further comprising:
a clock control circuit configured to output pulse signals as a test clock signal, the pulse signals corresponding to an active period of the test mode signal, among pulses of the clock signal; and
a counter configured to generate a test output enable signal by counting the test clock signal.

18. The power gating system according to claim 17, wherein the plurality of error detection circuits comprise a first error detection circuit and a second error detection circuit,
wherein the first error detection circuit comprises a scan chain including a plurality of first unit blocks,
wherein each of the first unit blocks comprises:
an inverter configured to receive one of the output node values according to a voltage having a lower level than the supply voltage;
a multiplexer configured to select an output signal of a previous stage or an output signal of the inverter according to the test output enable signal, and output the selected signal; and
a flip-flop configured to latch the output signal of the multiplexer according to the test clock signal, and output the latched signal.

19. The power gating system according to claim 18, wherein the second error detection circuit comprises a scan chain including a plurality of second unit blocks,
wherein each of the second unit blocks comprises:
an inverter configured to receive any one of the output node values according to a voltage having a higher level than the supply voltage;
a multiplexer configured to select an output signal of a previous stage or an output signal of the inverter according to the test output enable signal, and output the selected signal; and
a flip-flop configured to latch the output signal of the multiplexer according to the test clock signal, and output the latched signal.

20. The power gating system according to claim 19, wherein one or more of the plurality of error detection circuits further comprise a floating prevention circuit configured to prevent floating of an output node of the scan chain by retaining an output node thereof at a predetermined logic value, when the test mode signal is deactivated.

21. A power gating system comprising:
a logic circuit area configured to block a supply voltage from being supplied to a plurality of logic gates according to an activated power gating control signal;

a buffer configured to buffer a clock signal, a chip select signal and a command/address signal according to an activated buffer enable signal, and output the buffered signals;

a command decoder configured to generate a first power-down mode signal and a second power-down mode signal by decoding a test mode signal and the chip select signal and command/address signal buffered in the buffer;

a power gating control circuit configured to deactivate the buffer enable signal and activate the power gating control signal, when the first power-down mode signal is activated, and activate the buffer enable signal and the power gating control signal when the second power-down mode signal is activated; and a plurality of error detection circuits configured to receive output node values of some of the plurality of logic gates, and generate detection signals by detecting whether the received output node values float.

22. The power gating system according to claim 21, wherein when the second power-down mode signal is activated, one of the plurality of error detection circuits receives output node values of some of the plurality of logic gates, which are set to a logic low value according to a voltage having a lower level than the supply voltage.

23. The power gating system according to claim 22, wherein when the second power-down mode signal is activated, an other one of the plurality of error detection circuits receives output node values of some of the plurality of logic gates, which are set to a logic high value according to a voltage having a higher level than the supply voltage.

24. The power gating system according to claim 21, further comprising:
a clock control circuit configured to output pulse signals as a test clock signal, the pulse signals corresponding to an active period of the test mode signal, among pulses of the clock signal; and
a counter configured to generate a test output enable signal by counting the test clock signal.

25. The power gating system according to claim 24, wherein the plurality of error detection circuits comprise a first error detection circuit and a second error detection circuit,
wherein the first error detection circuit comprises a scan chain including a plurality of first unit blocks,
wherein each of the first unit blocks comprises:
an inverter configured to receive any one of the output node values according to a voltage having a lower level than the supply voltage;
a multiplexer configured to select an output signal of a previous stage or an output signal of the inverter according to the test output enable signal, and output the selected signal; and
a flip-flop configured to latch the output signal of the multiplexer according to the test clock signal, and output the latched signal.

26. The power gating system according to claim 25, wherein one or more of the plurality of error detection circuits further comprise a floating prevention circuit configured to prevent floating of an output node of the scan chain by retaining an output node thereof at a predetermined logic value, when a test mode signal is deactivated.

27. The power gating system according to claim 25, wherein the second error detection circuit comprises a scan chain including a plurality of second unit blocks,
wherein each of the second unit blocks comprises:
an inverter configured to receive any one of the output node values according to a voltage having a higher level than the supply voltage;
a multiplexer configured to select an output signal of a previous stage or an output signal of the inverter according to the test output enable signal, and output the selected signal; and
a flip-flop configured to latch the output signal of the multiplexer according to the test clock signal, and output the latched signal.

28. A power gating system comprising:
a logic circuit area configured to block a supply voltage from being supplied to a plurality of logic gates when a test power-down mode is enabled; and
a plurality of error detection circuits configured to detect logic gates whose output nodes float, among the plurality of logic gates, when the test power-down mode is activated,
wherein the plurality of error detection circuits are configured to detect the logic gates with floating output nodes by applying a first voltage with a lower level than the supply voltage and a second voltage with a higher level than the supply voltage.

29. The power gating system according to claim 28, wherein some of the plurality of logic gates are power-gated for the supply voltage, and
the other logic gates of the plurality of logic gates are power-gated for a ground voltage.

30. The power gating system according to claim 28, wherein one of the plurality of error detection circuits detects the floating of the output nodes of some of the plurality of logic gates and sets output node values to a logic low value when the first voltage is applied in the test power down mode.

31. The power gating system according to claim 28, wherein one of the plurality of error detection circuits detects the floating of the output nodes of some of the plurality of logic gates and sets output nodes values to a logic high value when the second voltage is applied in the test power down mode.

* * * * *